(12) United States Patent
Kalnitsky et al.

(10) Patent No.: US 6,169,310 B1
(45) Date of Patent: Jan. 2, 2001

(54) ELECTROSTATIC DISCHARGE PROTECTION DEVICE

(75) Inventors: Alexander Kalnitsky, San Francisco; Pavel Poplevine, Foster City; Albert Bergemont, Palo Alto; Hengyang (James) Lin, San Jose, all of CA (US)

(73) Assignee: National Semiconductor Corporation, Sunnyvale, CA (US)

( * ) Notice: Under 35 U.S.C. 154(b), the term of this patent shall be extended for 0 days.

(21) Appl. No.: 09/205,110

(22) Filed: Dec. 3, 1998

(51) Int. Cl.$^7$ ................................................. H01L 23/62
(52) U.S. Cl. .............................................................. 257/355
(58) Field of Search ............................................... 257/355

(56) References Cited

U.S. PATENT DOCUMENTS 4,266,100 * 5/1981 Hoppner et al. .
4,725,876 * 2/1988 Kishi .
4,947,226 * 8/1990 Huang et al. .
5,079,516 * 1/1992 Russell et al. .

OTHER PUBLICATIONS

Bertram, W. J.; Yield and Reliability, VLSI Technology, 2 Ed., pp. 648–650 (S.M. Sze Ed.), McGraw–Hill (1988).

* cited by examiner

*Primary Examiner*—Stephen D. Meier
(74) *Attorney, Agent, or Firm*—Limbach & Limbach LLP

(57) ABSTRACT

An ESD protection device for use with an integrated circuit that provides a low impedance resistive path between IC pads (including $V_{dd}$ and $V_{ss}$ pads) when power to the IC is off, while assuring adequate isolation between the IC pads when the power is on. The device includes a semiconductor substrate (typically a p-type Si substrate) and at least two vertically integrated pinch resistors formed in the semiconductor substrate. Each of the vertically integrated pinch resistors is connected to a common electrical discharge line and to a pad. Each of the vertically integrated pinch resistors includes a deep well region and a first surface well region, both of the second conductivity type (typically n-type). The first surface well region circumscribes the deep well region, thereby forming a narrow channel region of the first conductivity type (e.g. p-type) therebetween. When no potential is applied to the first surface well regions (i.e. power is off), the two vertically integrated pinch resistors connected by the common electrical discharge line provide a low impedance resistive path between the pads for shunting ESD current. When a potential is applied to the first surface well region by the IC power supply (i.e. power is on), however, the width of the narrow channel region is pinched-off due to a potential-produced depletion region in the narrow channel region, thereby isolating the pads from each other. A process for the formation of the ESD protection device involves sequential formation of each of the device regions in a semiconductor substrate.

6 Claims, 7 Drawing Sheets

ELECTROSTATIC DISCHARGE PROTECTION DEVICE

BACKGROUND OF THE INVENTION

1. Field of the Invention

The present invention relates to integrated circuit elements and, in particular, to electrostatic discharge (ESD) protection devices for use in integrated circuits and processes for their manufacture.

2. Description of the Related Art

Electrostatic discharge (ESD) protection devices are commonly connected to individual input and output pads of integrated circuits to protect electronic devices in the integrated circuit from excessive voltage. See, for example, S. M. Sze, *Electrostatic Discharge Damage* in *VLSI Technology, Second Edition,* 648–650 (McGraw Hill, 1988), which is hereby incorporated by reference.

A variety of conventional ESD protection devices are also known which can provide a path, between a pair of normally isolated input and/or output pads, that becomes electrically conductive when the voltage differential across the pair of pads exceeds a predetermined value. Such conventional ESD protection devices make extensive use of diodes (often in the avalanche multiplication regime), metal-oxide-semiconductor (MOS) transistors (typically in the punch-through regime) and bipolar transistors (usually in punch-through mode). Since the electrical characteristics of diodes and MOS and bipolar transistors are, however, extremely device and manufacturing technology dependent, integrated circuits which employ these ESD protection devices often must be redesigned and recharacterized for each successive technology generation. In addition, conventional ESD protection devices typically do not protect electronic devices within the integrated circuit from ESD events which occur at the $V_{dd}$ and $V_{ss}$ pads.

Still needed in the art is an ESD protection device that provides protection to devices within an integrated circuit from ESD events at any pad, including $V_{dd}$ and $V_{ss}$, and that does not rely on technology dependent diodes or transistors.

SUMMARY OF THE INVENTION

The present invention provides an ESD protection device for use with an integrated circuit that creates a near "short circuit" (i.e. a low impedance resistive path) between IC pads (including $V_{dd}$ and $V_{ss}$ pads) when power to the IC is off, while assuring adequate isolation between IC pads when the power is on.

Electrostatic discharge (ESD) protection devices according to the present invention can be used in association with integrated circuits that have a power supply and a plurality of pads connected to each other via a current dissipating means. The ESD protection device in accordance with the present invention includes a semiconductor substrate of a first conductivity type (typically p-type) with an active area on its surface, and at least two vertically integrated pinch resistors formed in the semiconductor substrate. Each of the vertically integrated pinch resistors is connected to a common electrical discharge line and to a pad. Each of the two vertically integrated pinch resistors includes a deep well region of a second conductivity type (typically n-type) disposed below both the semiconductor substrate surface and the active area, as well as a first surface well region of the second conductivity type (e.g. n-type) disposed on the surface of the semiconductor substrate. The first surface well region circumscribes (i.e. encircles) both the deep well region and the active area of the semiconductor substrate, thereby forming a narrow channel region of the first conductivity type (e.g. p-type) in the semiconductor substrate. This narrow channel region separates the deep well region from the first surface well region. Each of the vertically integrated pinch resistors also includes a first contact region in the first surface well region, that is connected to the power supply of the integrated circuit, a second contact region in the active area, that is connected to a pad of the integrated circuit, and a third contact region in the semiconductor substrate, that is connected to the electrical discharge line.

When no potential is applied on the first contact regions (i.e. power is off), the two vertically integrated pinch resistors connected by the common electrical discharge line of the ESD protection device according to the present invention provide a low impedance resistive path between the pads. When a potential is applied to the first contact regions by means of the IC power supply (i.e. power is on), however, the width of the narrow channel region is pinched-off due to a potential-produced depletion region extending from the first surface well region into the narrow channel region toward the deep well region, thereby isolating the pads from each other.

A process for the formation of an ESD protection device according to the present invention includes first providing a semiconductor substrate of a first conductivity type (e.g. a p-type silicon substrate), followed by forming a plurality of deep well regions of a second conductivity type (e.g. n-type) embedded below its surface. Next, at least one electrical isolation region is formed on the surface of the semiconductor substrate above the deep well regions. A plurality, which is typically the same number as the number of the deep well regions, of surface well regions of the second conductivity type is then formed on the surface of the semiconductor substrate such that each of the first surface well regions circumscribes a different deep well region. A first contact region is subsequently formed on the surface of each of the first surface well regions. Next, a plurality of second contact regions are formed on the surface of the semiconductor substrate, each above a different deep well region, and a plurality of third contact regions are formed on the surface of semiconductor substrate, each outside of a perimeter formed by a different first surface well region. The first contact region, second contact region and third contact region are formed in such a manner that they are separated by the electrical isolation regions. Finally, an electrical discharge line, connected to and in common with all the third contact regions, is formed, as well as connections between the power supply of the IC and the first contact regions, and between a plurality of pads of the IC and the associated second contact regions. The resultant device includes a plurality of vertically integrated pinch resistors, each of which is connected to an electrical discharge line and a pad of the IC.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings of which.

DETAILED DESCRIPTION OF THE INVENTION

Figure 1:
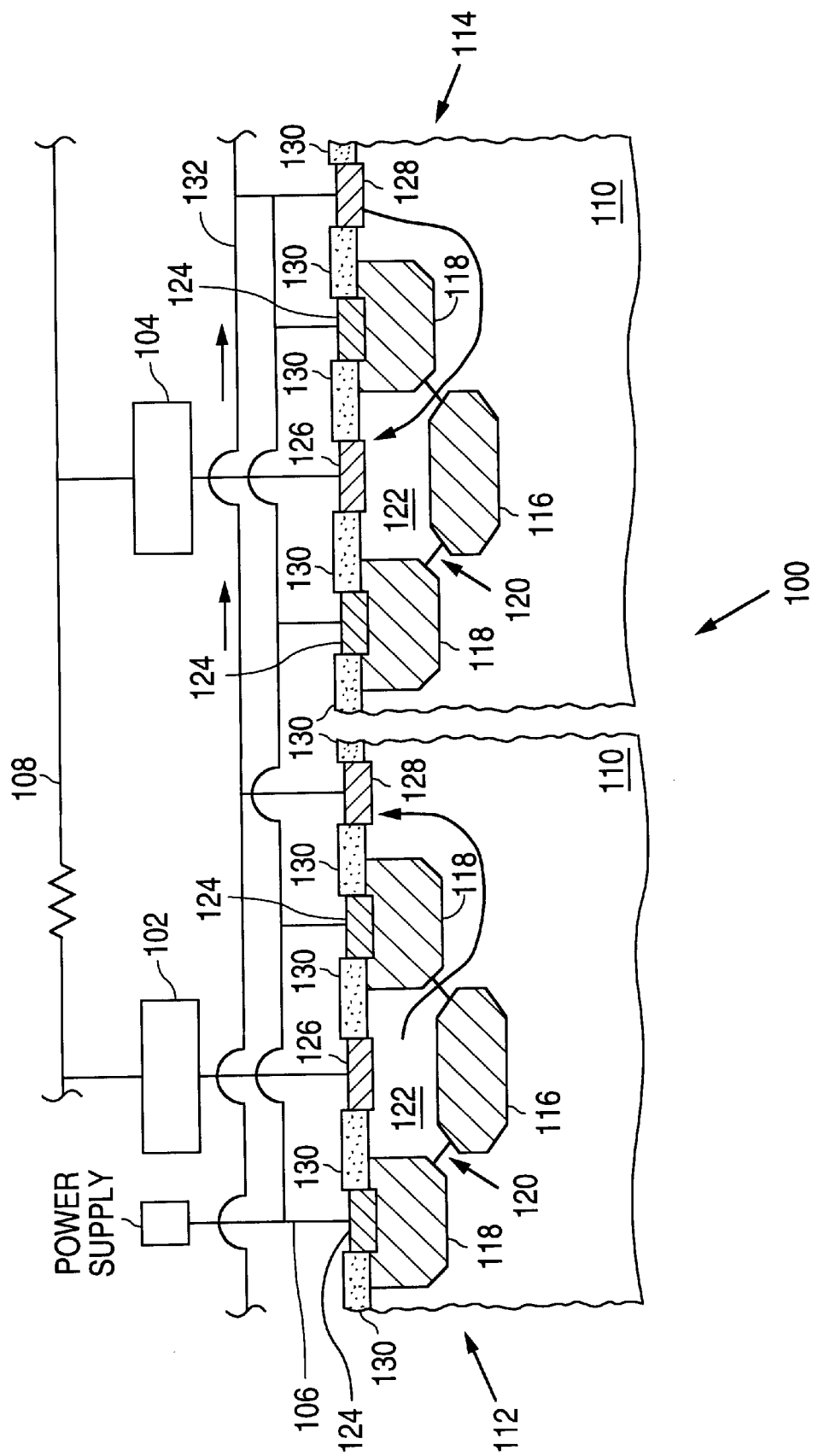
FIG. 1 is a combined cross-sectional and electrical schematic view of an ESD protection device in accordance with the present invention. The arrows depict the direction of current flow upon an ESD event that creates a potential difference between the two pads.

FIG. 1 depicts, in combined cross-sectional and electrical schematic format, an ESD protection device 100 according to the present invention for use in an integrated circuit (IC) where the IC includes at least two pads 102 and 104 (which can be $V_{ss}$ or $V_{dd}$ pads) for inputting or outputting electrical signals, power supply line 106, and a current dissipating means, such as resistor 108, connected between the pads 102 and 104. ESD protection device 100 includes a semiconductor substrate 110 of a first conductivity type (typically P-type) and two vertically integrated pinch resistors 112 and 114.

Each of the vertically integrated pinch resistors 112 and 114 includes a deep well region 116 of a second conductivity type (typically n-type) disposed below the surface of semiconductor substrate 110 and a first surface well region 118 of the second conductivity type that completely circumscribes (i.e. encircles) the deep well region 116. The peak carrier concentration in the deep well region is typically in the range of 1E+15 to 1E+16 ions per cm$^3$. The first surface well region 118 can partially overlap, or be offset (e.g. 0.5 microns to 7.0 microns) from, the deep well region 116.

The distance between the bottom of each of the two first surface well regions 118 and the associated surface of the semiconductor substrate 110, namely the depth of the first surface well region 118, is typically in the range of 0.7 microns (for a 0.1 micron process technology) to about 4.0 microns (for a 5 micron process technology). The distance from the top of each of the two deep well regions 116 to the associated surface of the semiconductor substrate 110 is predetermined based on the depth of the first surface well region 118. In one embodiment, the top of each deep well region 116 is approximately level with, or slightly underneath, the bottom of the associated first surface well region 118. A typical width for the deep well regions is 1 micron, while that of the first surface well regions is 0.4 microns.

Each of the deep well regions 116 is separated from the associated first surface well region 118 within the same vertically integrated pinch resistor by a narrow channel region 120, which is of the first conductivity type. At its narrowest point, narrow channel region 120 is typically from 0.2 microns to greater than 5.0 microns in width depending on the power supply voltage that will be employed to drive an associated integrated circuit. For a five (5) volt device technology, the narrow channel region 120 will typically be up to five (5) microns in width, while for a 3.3 volt technology, up to two (2) microns.

Each of the vertically integrated pinch resistors 112 and 114 optionally includes a second surface well region 122 of the first conductivity type on the surface of the semiconductor substrate 110 above the associated deep well region 116. Since the second surface well region 122 is of the same conductivity type as the semiconductor substrate 110, the second surface well region 122 need not be present in ESD protection devices according to the present invention. If the second surface well region 122 is not present, the region of the semiconductor substrate 110 above the deep well region is simply referred to as an active area. It is, however, standard practice to form such second surface well regions in conventional CMOS processing. The inclusion of a second surface well region 122 in each vertically integrated pinch resistor, therefore, provides for an ESD protection device that can be manufactured with a minimum number of deviations from standard semiconductor processing techniques.

Referring again to FIG. 1, each of the vertically integrated pinch resistors also includes first contact regions 124 disposed on the surface of the first surface well region 118, a second contact region 126 on the surface of the semiconductor substrate above the deep well region 116, and a third contact region 128 on the surface of the semiconductor substrate beyond the outer perimeter of the first surface well region 118. The first contact regions are of the same conductivity type as the first surface well region, while the second contact regions and third contact regions are of the same conductivity type as the semiconductor substrate. Typically, the first contact regions 124, second contact regions 126 and third contact regions 128 are formed by increasing the doping level of a portion of the first surface well regions 118, second surface well regions 122 and semiconductor substrates 110, respectively. For example, in the circumstance where the semiconductor substrate and second surface well region (or active area) are p-type, and the deep well region and first surface well region are, therefore, n-type, the first contact region is a simply more heavily doped n-type region (i.e. an n+ region) within the first surface well region. Similarly, the second contact region and third contact region are merely more heavily doped p-type regions (i.e. p+ regions) within the second surface well region (or active area) and semiconductor substrate, respectively.

First contact regions 124 serve as electrical connection nodes for connecting each of the vertically integrated pinch resistors to a common power supply of the associated integrated circuit via common power supply line 106. Each of the second contact regions 126 serves to connect the associated vertically integrated pinch resistor to a separate pad (e.g. pads 102 and 104 of FIG. 1). The third contact regions serve to connect the vertically integrated pinch resistors to a common electrical discharge line, as described further below. The depth of the first contact regions 124, second contact regions 126 and third contact regions 128, which is process technology dependent, is typically 0.05 micron to 1 micron. The width of these contact regions is typically greater than 0.2 micron.

Vertically integrated pinch resistors 112 and 114 also include electrical isolation regions 130, typically formed of silicon oxide ($SiO_2$), that separate and electrically isolate the first contact region 124, second contact region 126 and third contact region 128 from each other. Electrical isolation regions 130 also isolate each vertically integrated pinch resistor from other vertically integrated pinch resistors, as well as from nearby integrated circuit semiconductor devices (not shown). The ESD protection device 100 also includes a common electrical discharge line 132 connected to each of the third contact regions 128.

When the power supply to the IC is off (i.e. no potential is applied to the first surface well regions 118 through the first contact regions 124), the ESD protection device 100 according to the present invention provides a low impedance resistive path between the pads 102 and 104 of the IC (which can include the $V_{ss}$ and $V_{dd}$ pads) that are connected to the second contact regions 126. This low impedance resistive path is capable of dissipating an ESD event that creates a potential difference between the pads without the use of technology dependent diodes or transistors. In essence, when a high potential is created at one pad (e.g. by an ESD event) current is immediately discharged to another lower potential pad via the ESD protection device and then to a nearby current dissipating means, such as a resistor. At the resistor, the current is converted to, and dissipated as, heat.

If an ESD event creates a potential difference between pad 102 and pad 104, such an event will be essentially shorted or shunted through the two vertically integrated pinch resistors 112 and 114 via the following current path (indicated by the arrows in FIG. 1): second contact region 126 to second surface well region (or active area) 122, through narrow channel region 120, to substrate 110, and to third contact region 128, all of vertically integrated pinch resistor 112; through electrical discharge line 132; and then to third contact region 128, through substrate 110, to narrow channel region 120, through second surface well region (or active area) 122, to second contact region 126, all of vertically integrated pinch resistor 114; and subsequently to pad 104 and finally to current dissipating means, such as a resistor 108. This direction of current flow, or shunting, assumes that the ESD event created a potential at pad 102 that is higher than the potential at pad 104. Current would flow in the opposite direction if the potential difference was reversed.

The narrow channel regions 120 of the vertically integrated pinch resistors 112 and 114 are disposed between the first surface well region 118 and the deep well region 116 (both of which are typically n-type) within the same vertically integrated pinch resistor. When no potential is applied to the first contact regions 124, the resistance of these vertically integrated pinch resistors is typically in the range of 10 ohms to a few kilo-ohms. Therefore, the ESD protection device according to the present invention provides a near "short circuit" when the power to the IC is off. However, upon application of a potential (e.g. via power supply line 106) sufficient to produce depletion regions 200 (as indicated by perforated lines in FIG. 2) extending from the first surface well regions 118 toward the deep well regions 116, the resistance of the vertically integrated pinch resistors 112 and 114 can be increased to more than 100 kilo-ohms, or even to an essentially open circuit. When a potential is applied to the first contact regions 124 (i.e. when the power to the IC is on), these depletion regions "pinch off" the width of the narrow channel regions 120 by creating potential barriers within the vertically integrated pinch resistor current paths. If the depletion regions extend across the narrow channel regions until they meet the deep well regions, each of the vertically integrated pinch resistor current paths is completely blocked. This complete blockage of the vertically integrated pinch resistor current paths creates an essentially open circuit, and thus assures adequate electrical isolation, between the two pads 102 and 104 of the IC. In other words, the ESD protection device of the present invention insures that the pads are in their isolated state when power to the IC is on, while providing ESD protection when the power is off.

Figure 2:
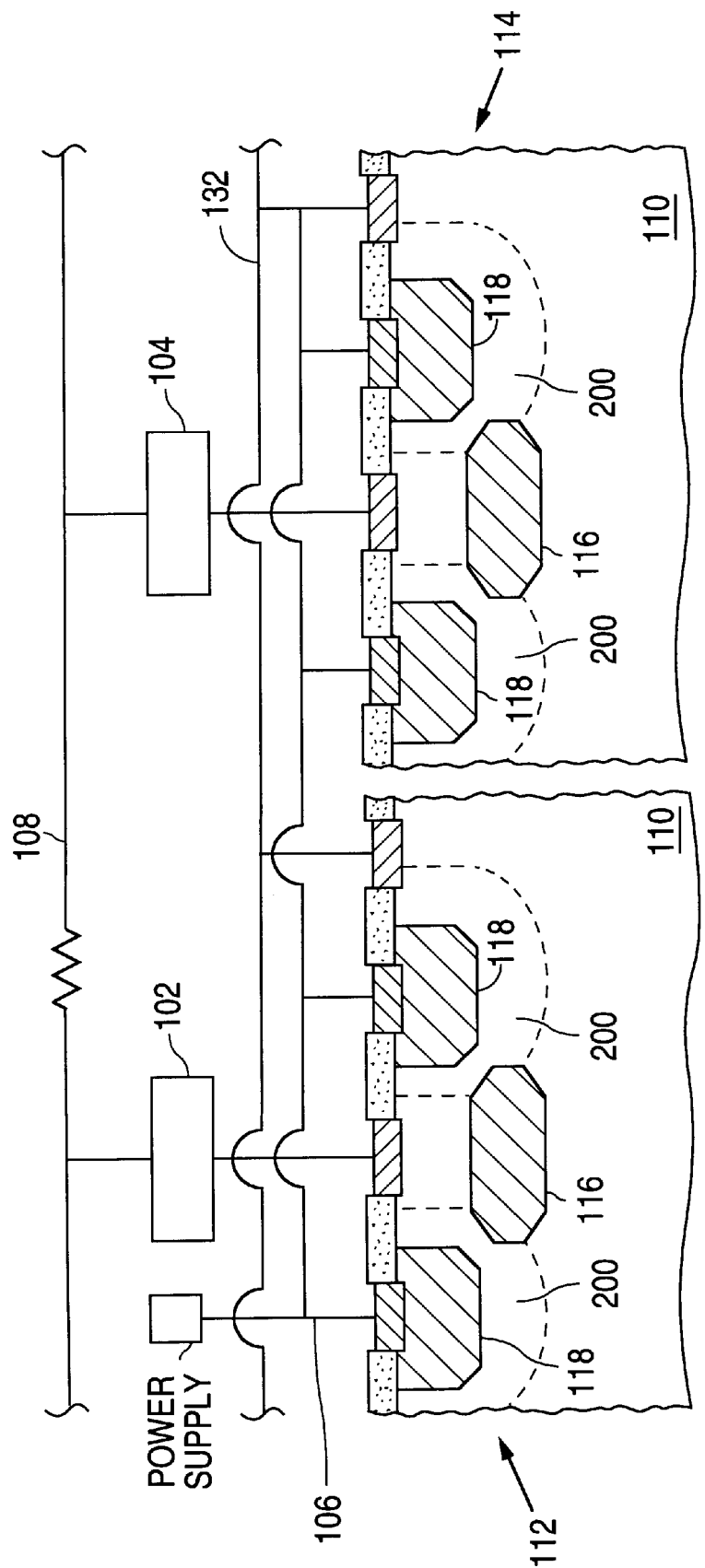
FIG. 2 is a combined cross-sectional and electrical schematic view of the ESD protection device of FIG. 1 with perforated lines depicting the presence of depletion regions "pinching off" the current path.
Figure 11:
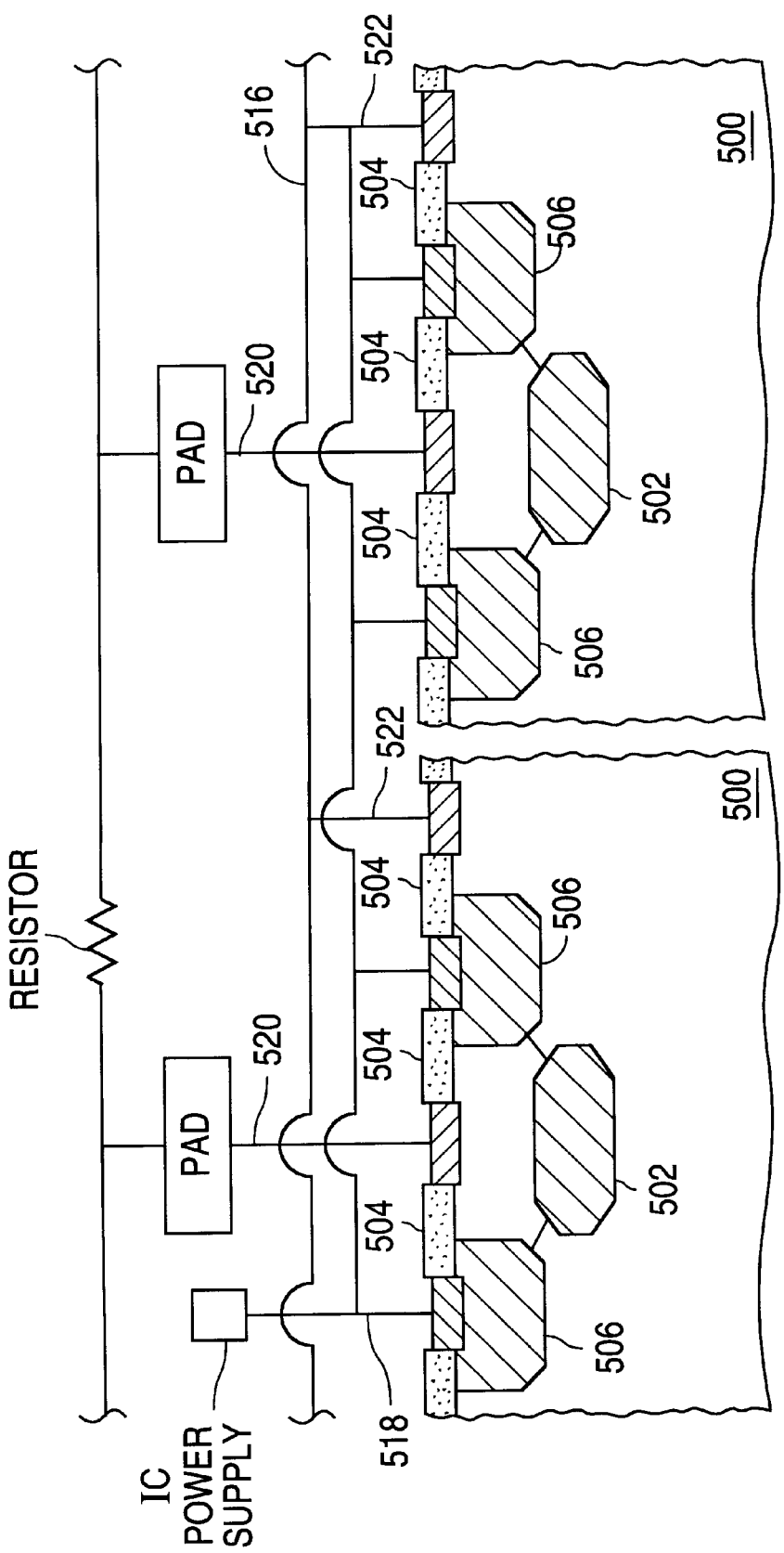
FIG. 11 is a combined cross-sectional and electrical schematic view of a stage in a process in accordance with the present invention.

The ESD protection device according to the present invention has so far been described with reference to FIGS. 1 and 2, which depicts two pads and two vertically integrated pinch resistors. While the ESD protection devices in accordance with the present invention require at least two pads and two vertically integrated resistors, the present invention is not limited to such structure. Rather, the present invention encompasses ESD protection devices that include a plurality of vertically integrated pinch resistors, each connected to a different pad and a common electrical discharge line. It is for this reason that the electrical discharge line illustrated in FIGS. 1 and 2 (as well as FIG. 11) is shown as non-terminated.

Figure 3:
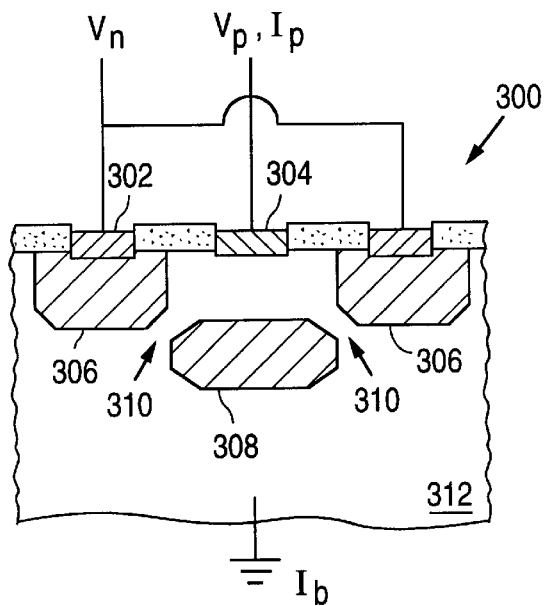
FIG. 3 is a combined cross-sectional and electrical schematic view of a grounded single isolated vertically integrated pinch resistor without a third contact region.
Figure 4:
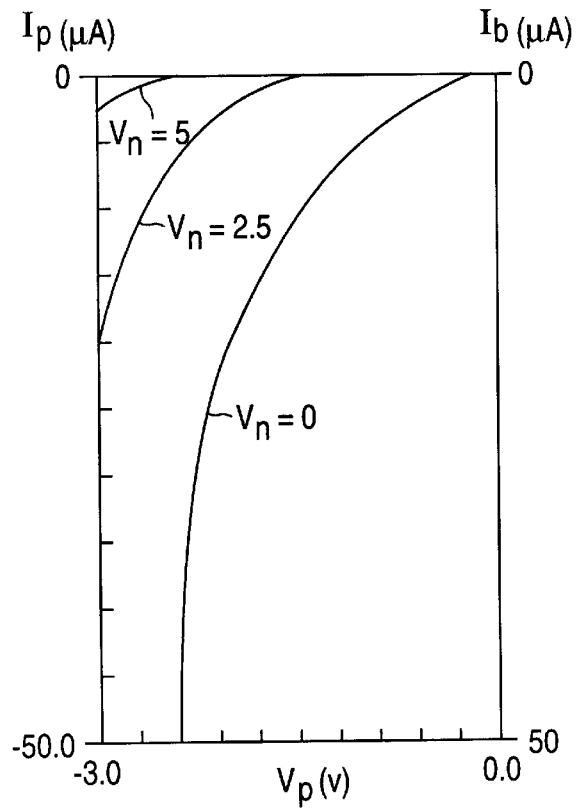
FIG. 4 is a current versus voltage (I-V) graph illustrating the idealized electrical behavior of the grounded single isolated vertically integrated pinch resistor of FIG. 3.

The electrical behavior of the vertically integrated pinch resistors 112 and 114 can be further understood in conjunction with FIGS. 3 and 4. FIG. 3 illustrates a grounded and isolated vertically integrated pinch resistor 300 without a third contact region. The I-V relationships for a prototype vertically integrated pinch resistor device equivalent to that illustrated in FIG. 3, with a rectangular periphery of approximately 1000 microns, are plotted in FIG. 4. When the first contact region 302 of the vertically integrated pinch resistor is at zero potential (i.e. $V_n=0$ volts), the second contact region 304 is connected to ground through a low impedance resistive path. When $V_n$ is zero, current ($I_p$ or $I_b$) flowing from the second contact region 304 to ground will increase as the potential on the second contact region ($V_p$) is increased, as shown in the $V_n=0$ curve of FIG. 4. However, once a potential is applied to the first contact region 302 and $V_n$ is increased significantly above 0 volts (e.g. 5 volts), the resistance between the second contact region 304 and ground is greatly increased due to formation of a depletion region (not shown) within a narrow channel region 310. Since the formation of the depletion region around a first surface well region 306 extending to a deep well region 308 "pinches off" the narrow channel region 310, current no longer flows through the vertically integrated pinch resistor at low values of $V_p$ This effect is illustrated by the $V_n=2.5$ curve and $V_n=5$ curve of FIG. 4. The pinching-off of the narrow channel region 310 creates a relatively high resistance path between the second contact region 304 and ground. When a sufficient amount of potential is applied to the first contact region (e.g. when a power supply to an IC is turned on) so that the depletion region extends all the way to the deep well region (i.e. complete pinch off of the narrow channel region), an essentially open circuit is created within the vertically integrated pinch resistor. If the semiconductor substrate 312 is p-type and doped on the order of 2E+15 per $cm^3$, an n-type deep well region and n-type first surface well region can be formed with a five (5) micron wide narrow channel region that will require an approximately 5 to 6 volt potential at the first contact region to shut-down the vertically integrated pinch resistor. Lower voltage shut-down operation can be achieved by reducing the width of the narrow channel region that separates the deep well region from the first surface well region.

Figure 5:
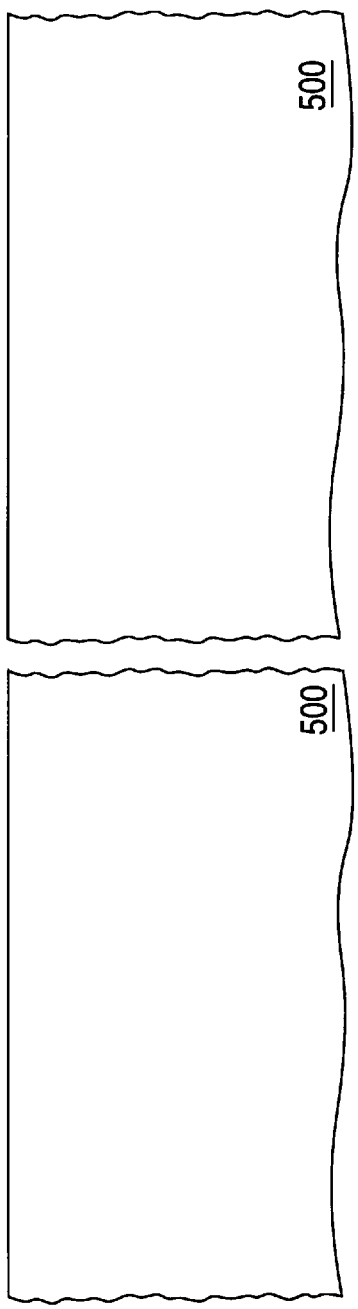
FIGS. 5–10 are cross-sectional views illustrating stages of a process according to the present invention.

Also provided is a process for manufacturing an ESD protection device for use with integrated circuits that is simple and compatible with standard CMOS and bipolar semiconductor manufacturing techniques. FIGS. 5–11 illustrate, using cross-sectional and cross-sectional with electrical schematic views, stages of such a formation process. A semiconductor substrate 500 of a first conductivity type (typically p-type silicon substrate) is initially provided, as shown in FIG. 5. Semiconductor substrate 500 can also take the form of an epitaxial layer overlying a single crystal substrate, such as a p-epitaxial layer on a p+ substrate. Although it is illustrated as two separate portions in FIG. 5, semiconductor substrate 500 is a single contiguous substrate. Such illustration is merely to emphasize that the two vertically integrated pinch resistors may be formed in non-adjacent portions of the semiconductor substrate.

Next, deep well regions 502 of a second conductivity type (typically n-type) are formed in semiconductor substrate 500. The deep well regions 502 can be formed using conventional photomasking, dopant ion implantation and thermal diffusion techniques known to those skilled in the art. Typical deep well region formation steps can include first forming a patterned deep well photomask on the surface of semiconductor substrate 500, followed by ion implantation, removal of the photomask, and thermal diffusion and activation of the implanted ions.

Figure 6:
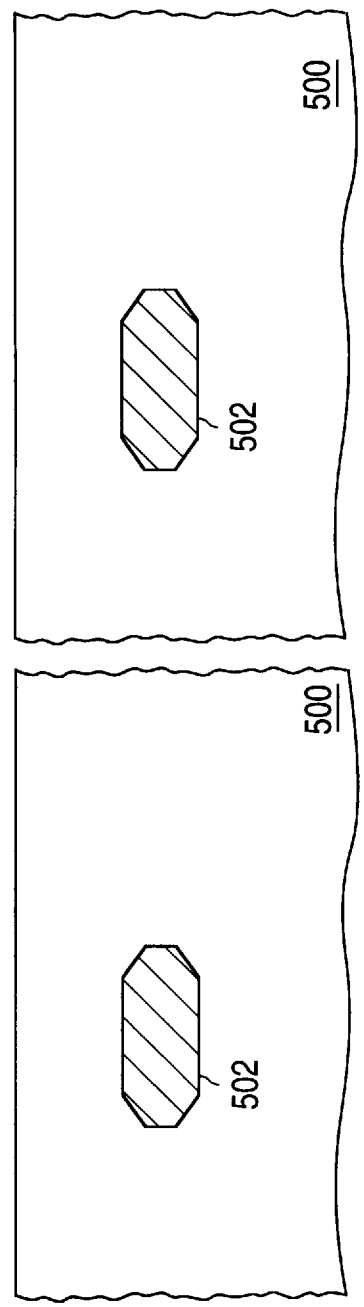

Typical conditions used for the formation of n-type deep well regions are a phosphorus ion implant through a patterned photomask with the phosphorous ($P_{31}+$) ion dose being in the range of 1E+12 to 1E+14 ions/cm$^2$ and the implant energy being in the range of 100 KeV to 1000 KeV. After removal of the patterned photomask, the implanted phosphorus ions are thermally diffused into the semiconductor substrate 500 at a temperature of 1000° C. to 1175° C. for several hours in a 5%–10% oxygen ($O_2$) ambient. The resultant structure, following removal of any silicon oxide ($SiO_2$) layer grown on the surface of the semiconductor substrate during the thermal diffusion process, is illustrated in FIG. 6. When forming n-type deep well regions, any n-type dopant can be used, including, phosphorus, arsenic or antimony. If arsenic or antimony is employed, thermal diffusion at a higher temperature may be required since these dopants diffuse at a slower rate than phosphorus at any given temperature. In addition, since phosphorus is lighter than arsenic or antimony, phosphorus ion can be more easily implanted to the required depth. The 5–15% $O_2$ ambient is used to accelerate the diffusion.

Figure 7:
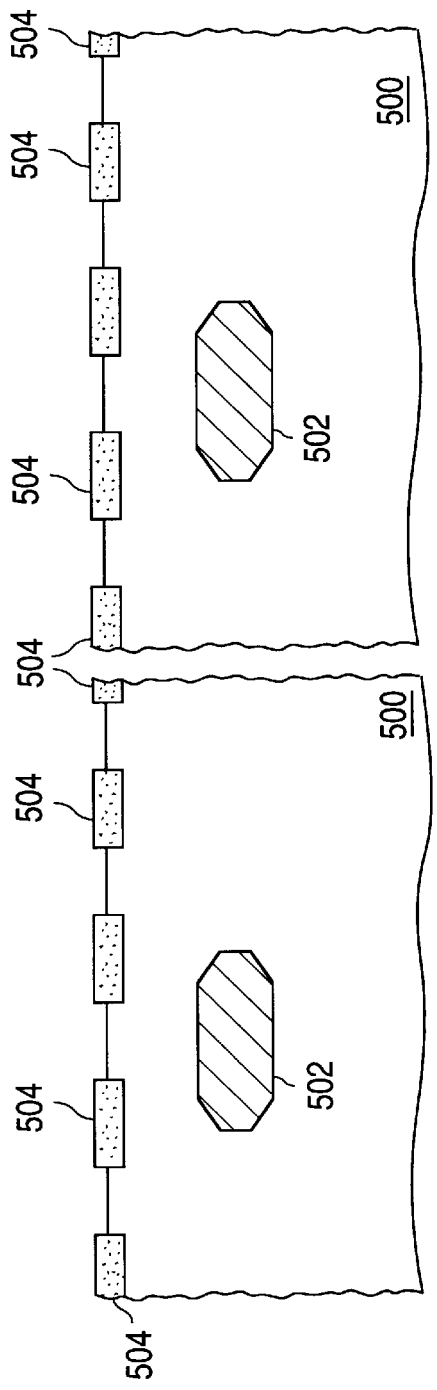

Next, electrical isolation regions 504 are formed, as illustrated in FIG. 7, using conventional processes such as Shallow Trench Isolation (STI) or LOCal Oxidation of Silicon (LOCOS) that are well known in the art. The dimensions of the electrical isolation regions are dependent on the process technology used to form the integrated circuit with which the ESD protection device will be used. The thickness of a typical electrical isolation region formed by LOCOS is, however, in the range of 2000 angstroms to 5000 angstroms, while that formed by STI is in the range of 2000 angstroms to 4000 angstroms.

Figure 8:
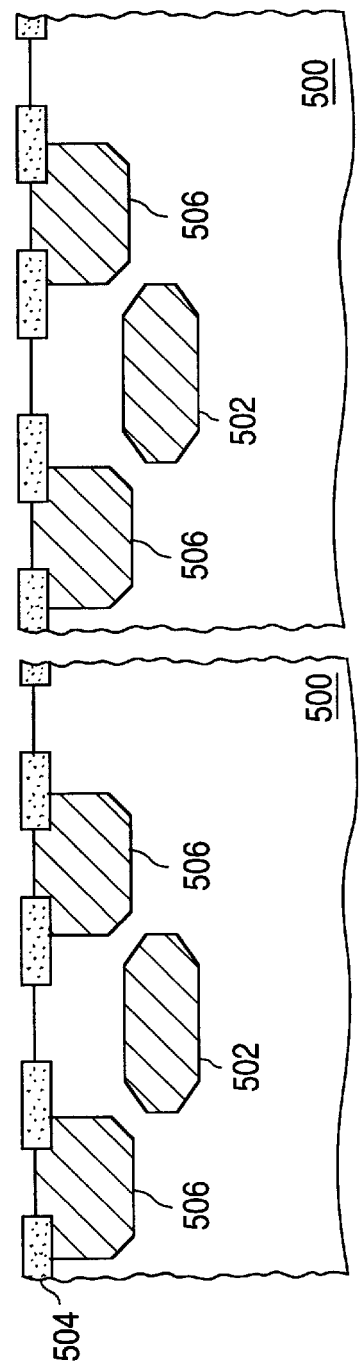
Figure 9:
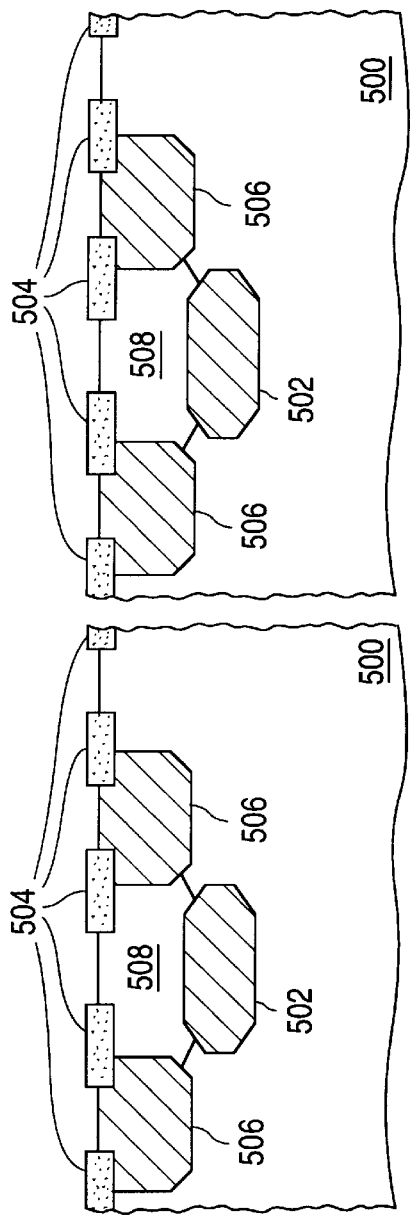

First surface well regions 506 of the second conductivity type (e.g. n-type) are then formed on the surface of semiconductor substrate 500 such that each of the first surface well regions 506 circumscribes (i.e. encircles) one of the deep well regions 502. The resulting structure is illustrated in FIG. 8. The distance between the inner contour of the first surface well regions and the outer boundary of the deep well regions (i.e. the width of a narrow channel region therebetween) determines the "pinch-off" voltage of the ESD protection device, namely the voltage that must be applied to the first contact regions in order to form a depletion region completely blocking the narrow channel region. First surface well regions 506 can be formed using conventional photomasking and dopant ion implantation techniques known to those skilled in the art. Typical first surface well region formation steps include first forming a patterned first surface well photomask on the surface of semiconductor substrate 500, followed by ion implantation and removal of the photomask. Typical conditions for the formation of n-type first surface well regions are a phosphorus ion implant through a patterned photomask, with the phosphorous ($P_{31}+$) ion dose being in the range of 1E+11 to 1E+12 ions/cm$^2$ and the implant energy being in the range of 100 KeV to 200 KeV. Thermal diffusion steps are infrequently used with surface well region ion implantation techniques, but when employed the typical temperature of such a thermal diffusion is in the range of 900° C. to 1150° C.

Next, second surface well regions 508 of the first conductivity type (e.g. p-type) are optionally formed in the semiconductor substrate above the deep well regions 502, using standard photomasking and dopant ion implantation techniques. For a p-type second surface well region formation, a boron ($B_{11}+$) ion dose in the range of 1E+11 to 1E+13 ions per cm$^2$ at an energy of 60 KeV to 150 KeV energy would be typical. Although it is not required with respect to operation of the ESD protection device according to the present invention, it would be preferable to have as highly a doped second surface well region as possible (along with a highly doped semiconductor substrate), in order to reduce the impedance of the vertically integrated pinch resistors. The resulting structure is depicted in cross-section in FIG. 9.

Figure 10:
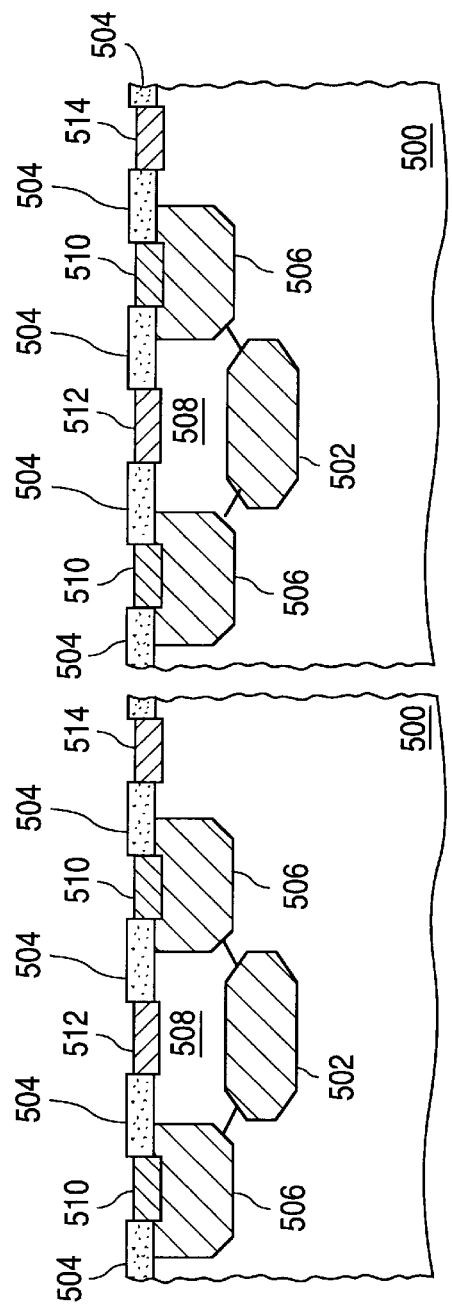

Next, first contact regions 510 are formed on the surface of first surface well region 506 using, for example, standard photomasking and ion implantation techniques. A typical dose for a heavily phosphorus ion doped n-type first contact region is in the range of 1E+15 to 1E+16 ions per cm$^2$. Second contact regions 512 and third contact regions 514 are then formed on the surface of the semiconductor substrate 500 using, for example, standard photomasking and ion implantation techniques. A typical dose for a heavily boron ion doped p-type second contact region or third contact region is in the range of 1E+15 to 1E+16 ions per cm$^2$. The first contact regions, second contact regions and third contact regions are formed in such a manner that they are separated by the electrical isolation regions. The resulting cross sectional structure is shown in FIG. 10.

An electrical discharge line 516, connected to and in common with all the third contact regions, is subsequently formed, as well as electrical connections 522 between the electrical discharge line 516 and the third contact regions. Also formed are electrical connections 518 between the power supply of the IC and the first contact regions, as well as electrical connections 520 between a plurality of pads of the IC that are connected through a current dissipating means, such as a resistor, and the associated second contact regions. The formation of the electrical discharge line 516 and the electrical connections can be accomplished by depositing a dielectric layer, etching contacts through the dielectric layer using standard photomasking and etching techniques, and then forming metal lines via metal layer deposition and patterning techniques known in the art. The resulting structure is shown in combined cross-sectional and electrical schematic views in FIG. 11.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An electrostatic discharge (ESD) protection device for use with an integrated circuit, the integrated circuit having a power supply and a plurality of pads connected to each other via a resistor, the ESD protection device comprising:

a semiconductor substrate of a first conductivity type having an active area on its surface;

at least two vertically integrated pinch resistors formed in the semiconductor substrate, each of the vertically integrated pinch resistors including:
- a deep well region of a second conductivity type disposed below the active area of the semiconductor substrate;
- a first surface well region of the second conductivity type disposed on the surface of the semiconductor substrate, the first surface well region circumscribing the deep well region and the active area of the semiconductor substrate;
- a narrow channel region of the first conductivity type disposed in the semiconductor substrate, the narrow channel region separating the deep well region from the first surface well region;
- a first contact region disposed in the first surface well region and connected to the power supply of the integrated circuit;
- a second contact region disposed in the active area and connected to a pad of the integrated circuit; and
- a third contact region disposed in the semiconductor substrate;

an electrical discharge line electrically connecting each of the third contact regions;

a first electrical connection connecting the first contact regions to the power supply of the integrated circuit;

a second electrical connection connecting the second contact regions to the pad of the integrated circuit; and a third electrical connection connecting the third contact regions to the electrical discharge line;

whereby, when no potential is applied to the first contact regions (i.e. the power supply of the integrated circuit is off), the two vertically integrated pinch resistors connected by the common electrical discharge line via the third contact regions provide a low impedance resistive path between the pads for shunting ESD current, and when a potential is applied to the first contact regions via the power supply of the integrated circuit, the low impedance resistive path is pinched-off due to formation of a depletion region in the narrow channel region, thereby isolating the pads that are connected to the second contact regions from each other.

2. The ESD protection device of claim 1 further including at least one electrical isolation region separating and electrically isolating the first contact region from the second contact region.

3. The ESD protection device of claim 1 wherein the active area includes a second surface well region of the first conductivity type.

4. The ESD protection device of claim 1 wherein the narrow channel region separates the deep well region from the first surface well region by a distance of 0.2 microns to 5.0 microns.

5. The ESD protection device of claim 1 wherein the first conductivity type is p-type and the second conductivity type is n-type and the deep well region and first surface well regions are doped with phosphorous ion to a peak carrier concentration in the range of 1E+15 to 1E+16 ions per cm$^3$.

6. The ESD protection device of claim 1 wherein the pads include at least one of a $V_{ss}$ pad and a $V_{dd}$ pad of the integrated circuit.

* * * * *

UNITED STATES PATENT AND TRADEMARK OFFICE
CERTIFICATE OF CORRECTION

PATENT NO. : 6,169,310 B1  
DATED : January 2, 2001  
INVENTOR(S) : Kalnitsky et al.

Page 1 of 1

It is certified that error appears in the above-identified patent and that said Letters Patent is hereby corrected as shown below:

<u>Title page,</u>  
Item [73] delete " Sunnyvale, CA (US)" and replace with -- Santa Clara, CA (US) --.

Signed and Sealed this

Twenty-fifth Day of September, 2001

*Attest:*

*Nicholas P. Godici*

*Attesting Officer*

NICHOLAS P. GODICI  
*Acting Director of the United States Patent and Trademark Office*